(12) United States Patent
Saito et al.

(10) Patent No.: US 8,155,163 B2
(45) Date of Patent: Apr. 10, 2012

(54) PHOTONIC CRYSTAL LASER AND METHOD OF MANUFACTURING PHOTONIC CRYSTAL LASER

(75) Inventors: Hirohisa Saito, Osaka (JP); Hideki Matsubara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 25 days.

(21) Appl. No.: 12/531,855

(22) PCT Filed: Jan. 29, 2008

(86) PCT No.: PCT/JP2008/051241
§ 371 (c)(1),
(2), (4) Date: Sep. 17, 2009

(87) PCT Pub. No.: WO2008/117562
PCT Pub. Date: Oct. 2, 2008

(65) Prior Publication Data
US 2010/0103972 A1    Apr. 29, 2010

(30) Foreign Application Priority Data
Mar. 23, 2007  (JP) .................................. 2007-075902

(51) Int. Cl.
*H01S 5/00* (2006.01)
(52) U.S. Cl. ...................................................... 372/50.1
(58) Field of Classification Search .................. 372/50.1
See application file for complete search history.

(56) References Cited

U.S. PATENT DOCUMENTS

| | | | |
|---|---|---|---|
| 5,642,371 A | 6/1997 | Tohyama et al. | |
| 2004/0247009 A1* | 12/2004 | Noda et al. | 372/99 |
| 2005/0123014 A1* | 6/2005 | Shimizu et al. | 372/45 |
| 2005/0232321 A1* | 10/2005 | Inoue et al. | 372/43.01 |
| 2006/0187991 A1* | 8/2006 | Thornton | 372/46.013 |
| 2006/0245464 A1 | 11/2006 | Hori et al. | |

FOREIGN PATENT DOCUMENTS

| | | |
|---|---|---|
| EP | 1 879 272 | 1/2008 |
| JP | 07-066487 | 3/1995 |
| JP | 2003-273453 | 9/2003 |
| JP | 2004-253811 | 9/2004 |
| JP | 2005-277219 | 10/2005 |
| JP | 2006-156901 | 6/2006 |
| JP | 2006-156944 | 6/2006 |
| JP | 2007-067182 | 3/2007 |
| WO | WO 2006/117863 | 11/2006 |
| WO | WO-2007/029538 A1 | 3/2007 |

* cited by examiner

*Primary Examiner* — Patrick Stafford
(74) *Attorney, Agent, or Firm* — Venable LLP; Michael A. Satori; Leigh D. Thelen

(57) ABSTRACT

A photonic crystal laser comprises an n-type substrate, an n-type clad layer, an active layer, a p-type clad layer, a photonic crystal layer, a p-type electrode, an n-type electrode and a package member. The n-type clad layer is formed on a first surface of the n-type substrate. The active layer is formed on the n-type clad layer. The p-type clad layer is formed on the active layer. The photonic crystal layer is formed between the n-type clad layer and the active layer or between the active layer and the p-type clad layer, and includes a photonic crystal portion. The p-type electrode is formed on the photonic crystal portion. The n-type electrode is formed on a second surface, and includes a light-transmitting portion arranged on a position opposed to the photonic crystal portion and an outer peripheral portion having lower light transmittance than the light-transmitting portion.

6 Claims, 7 Drawing Sheets

PHOTONIC CRYSTAL LASER AND METHOD OF MANUFACTURING PHOTONIC CRYSTAL LASER

TECHNICAL FIELD

The present invention relates to a photonic crystal laser and a method of manufacturing a photonic crystal laser, and it relates to a photonic crystal laser and a method of manufacturing a photonic crystal laser employable for a laser printer or a recording medium reader/writer, for example.

BACKGROUND ART

Following high densification of a recording medium, wavelength shortening of a laser employed for reading/writing progresses from conventional red to blue. A nitride-based compound semiconductor, particularly a GaN (gallium nitride)-based material is employed for a blue laser. On the other hand, a VCSEL-based surface emitting laser structure observed in a red laser requires several 10 layers of reflecting mirrors (DBR) due to small refractive index difference of the same type of material in a GaN-based material. Therefore, it is difficult to prepare a VCSEL (Vertical Cavity Surface Emitting LASER)-based surface emitting laser, and only an edge emitting type laser is available. However, the performance of the edge emitting laser cannot be inspected before a cavity mirror is prepared by cleavage. Consequently, there arise such problems that a substrate cannot be effectively used while the yield is inferior, and the cost is increased.

While engineering development of the VCSEL-based surface emitting laser is also in progress, on the other hand, a photonic crystal laser is being noted as a novel laser against this. A photonic crystal is prepared by artificially forming a periodic structure of a dielectric. The periodic structure is formed by periodically providing a region different in refractive index from the dielectric body in the body. Bragg diffraction occurs in the crystal due to the periodic structure, and an energy band gap is formed in relation to the energy of light thereof.

Japanese Patent Laying-Open No. 2005-277219 (Patent Document 1) describes a photonic crystal laser employing a GaAs-based material as such a photonic crystal laser. In Patent Document 1, a material transmitting a laser beam is employed as an electrode material, to extract the laser beam by transmitting the same. However, a current must be increased in order to obtain high output, and the film thickness of the electrode must also be increased in order to increase the current. Although the electrode transmits the laser beam, absorption increases if the film thickness thereof is increased, and it is difficult to efficiently increase the output.

As other photonic crystal lasers, Japanese Patent Laying-Open No. 2003-273453 (Patent Document 2) and Japanese Patent Laying-Open No. 2004-253811 (Patent Document 3) describe lasers employing photonic crystals. In each of the photonic crystal lasers according to Patent Documents 2 and 3, no photonic crystal structure is formed immediately under an electrode but a photonic crystal structure is formed on another portion, to cause lasing by resonance. However, each of the photonic crystal lasers according to Patent Documents 2 and 3 employs no region into which carriers are sufficiently injected for the lasing and output improvement after the lasing, and hence it is disadvantageously difficult to obtain efficient output.

Patent Document 1: Japanese Patent Laying-Open No. 2005-277219
Patent Document 2: Japanese Patent Laying-Open No. 2003-273453
Patent Document 3: Japanese Patent Laying-Open No. 2004-253811

DISCLOSURE OF THE INVENTION

Problems to be Solved by the Invention

Accordingly, an object of the present invention is to provide a photonic crystal laser capable of improving the output and a method of manufacturing a photonic crystal laser.

Means for Solving the Problems

The photonic crystal laser according to the present invention comprises an n-type substrate, an n-type clad layer, an active layer, a p-type clad layer, a photonic crystal layer, a p-type electrode, an n-type electrode and a package member. The n-type substrate includes a first surface and a second surface opposite to the first surface, and is conductive. The n-type clad layer is formed on the first surface of the n-type substrate. The active layer is formed on the n-type clad layer, and emits light. The p-type clad layer is formed on the active layer. The photonic crystal layer is formed between the n-type clad layer and the active layer or between the active layer and the p-type clad layer, and includes a photonic crystal portion having a photonic crystal structure. The p-type electrode is formed on the photonic crystal portion. The n-type electrode is formed on the second surface of the n-type substrate, and includes a light-transmitting portion arranged on a position opposed to the photonic crystal portion and an outer peripheral portion having lower transmittance of the light than the light-transmitting portion. The package member is formed on the p-type electrode.

In the method of manufacturing a photonic crystal laser according to the present invention, the following steps are carried out: First, the step of preparing a conductive n-type substrate including a first surface and a second surface opposite to the first surface is carried out. Then, the step of forming an n-type clad layer on the first surface of the n-type substrate is carried out. Then, the step of forming an active layer emitting light on the n-type clad layer is carried out. Then, the step of forming a p-type clad layer on the active layer is carried out. Then, the step of forming a photonic crystal layer, formed between the n-type clad layer and the active layer or between the active layer and the p-type clad layer, including a photonic crystal portion having a photonic crystal structure is carried out. Then, the step of forming a p-type electrode on the photonic crystal portion is carried out. Then, the step of forming an n-type electrode including a light-transmitting portion arranged on a position opposed to the photonic crystal portion and an outer peripheral portion having lower transmittance of the light than the light-transmitting portion on the second surface of the n-type substrate is carried out. Then, the step of forming a package member on the p-type electrode is carried out.

According to the inventive photonic crystal laser and method of manufacturing a photonic crystal laser, the p-type electrode is formed on the position opposed to the photonic crystal portion, whereby a current can be sufficiently injected from the p-type electrode into the photonic crystal portion, although a p-type semiconductor has higher resistance as compared with an n-type semiconductor and hence a current hardly spreads in a plane. The n-type semiconductor has lower resistance as compared with the p-type semiconductor and hence a current easily spreads in a plane, whereby injection of the current is possible even if the outer peripheral portion serving as the electrode of the n-type electrode is not arranged on the position opposed to the photonic crystal portion. Further, the light-transmitting portion of the n-type electrode is arranged on the position opposed to the photonic crystal portion, whereby extracted light is hardly absorbed. Consequently, reduction of output can be suppressed. In addition, the active layer is arranged on a position close to the package member, whereby heat resulting from absorption of carriers causing nonradiative recombination or emitted light is effectively dispersed/removed, and the heat radiation situation can be improved. Therefore, lasing inhibition or reduction of life resulting from temperature rise can be suppressed. Consequently, reliability can be improved.

Preferably in the aforementioned photonic crystal laser, a mesa structure is formed on the outer periphery of the p-type electrode, and an insulating film is formed on at least part of the surface of the mesa structure.

Thus, a reactive current (leakage current) flowing in the plane of the layer provided with the mesa structure can be limited, whereby the output can be improved. Further, the insulating film can prevent a short circuit resulting from a connecting member when the package member and the p-type electrode are connected with each other. As to the progress of the light spreading from the photonic crystal portion, loss can be suppressed by returning light reflected by the insulating film, formed on the surface of the mesa structure through the refractive index difference between the same and at least the p-type layer or the n-type substrate to the photonic crystal portion.

Preferably in the aforementioned photonic crystal laser, the light-transmitting portion includes the whole region defined by projecting the photonic crystal portion on the second surface of the n-type substrate as viewed from the side of the p-type electrode. Thus, the light-transmitting portion can be widely set while absorption of the light can be further suppressed, whereby output reduction can be further suppressed.

Preferably in the aforementioned photonic crystal laser, the light-transmitting portion includes the whole region defined by projecting the photonic crystal portion on the second surface of the n-type substrate as viewed from the side of the p-type electrode, and the light-transmitting portion further includes an electrode provided with uniformly dispersed openings and electrically connected with the outer peripheral portion.

With the electrode provided with the uniformly dispersed openings, the current can be increased while suppressing unevenness in current density. Therefore, the light can be extracted from the light-transmitting portion by improving the output.

Preferably, the aforementioned photonic crystal laser further comprises a transparent electrode, made of a material transparent with respect to the light, arranged on the light-transmitting portion and electrically connected with the outer peripheral portion of the n-type electrode.

Thus, the current can be injected through the outer peripheral portion and the transparent electrode as the electrodes, whereby the current can be increased. Further, the transparent electrode can be thinly formed since the current is fed on the outer peripheral portion and hence absorption of the light can be suppressed, whereby the output can be efficiently increased.

The light-transmitting portion may be provided with a nonreflective coat for reducing a reflecting component resulting from the refractive index difference between the n-type substrate and the atmosphere.

Preferably in the aforementioned photonic crystal laser, the n-type substrate is made of gallium nitride. The conductive substrate made of gallium nitride is so employed that the light-transmitting portion can efficiently transmit the light.

Effects of the Invention

Thus, according to the present invention, the photonic crystal laser comprises the n-type electrode including the light-transmitting portion arranged on the position opposed to the photonic crystal portion and the outer peripheral portion having the lower transmittance of the light than the light-transmitting portion and the p-type electrode formed on the photonic crystal portion, whereby the output can be improved.

Figure 1:
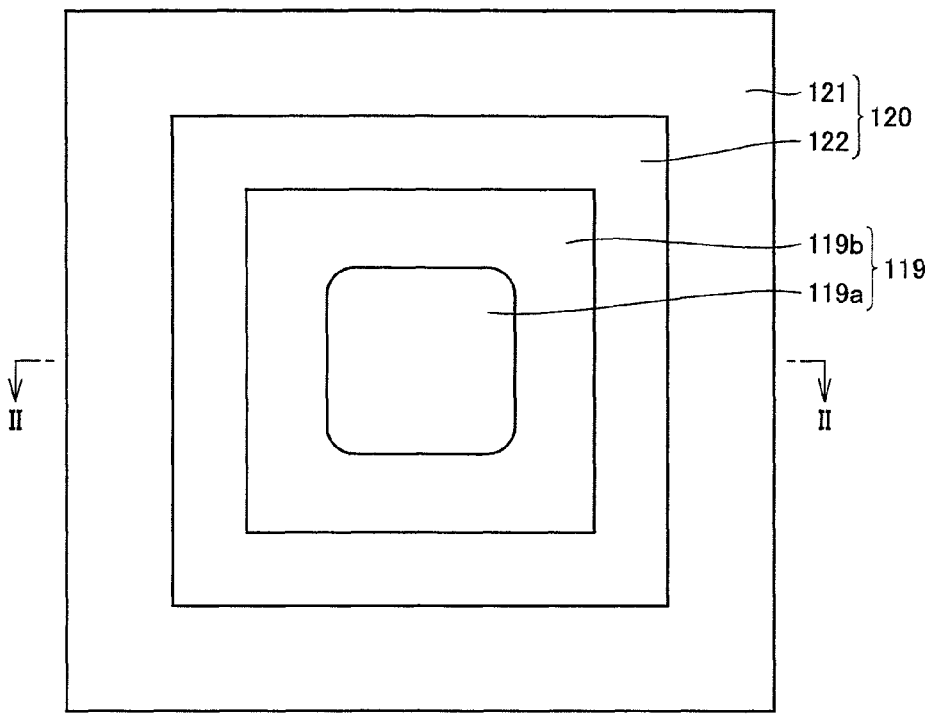
FIG. 1 is a schematic top plan view showing a photonic crystal laser according to a first embodiment of the present invention.

DESCRIPTION OF THE REFERENCE SIGNS 100, 200, 300 photonic crystal laser, 110 device, 111 n-type substrate, 111a first surface, 111b second surface, 112 n-type clad layer, 112a, 160 insulating film, 113 active layer, 114 p-type guide layer, 114a p-type electron blocking layer, 115 photonic crystal layer, 115a photonic crystal portion, 115a1 low refractive index portion, 115a2 high refractive index portion, 116 p-type clad layer, 117 p-type contact layer, 118 p-type electrode, 119 n-type electrode, 119a light-transmitting portion, 119a1 electrode, 119a2 opening, 119b outer peripheral portion, 119c transparent electrode, 120 package member, 121 stem package, 122 submount, 130 connecting member, 140 ball portion, 141 wire, 151 p-type pad electrode, D1, D2 diameter.

BEST MODES FOR CARRYING OUT THE INVENTION

Embodiments of the present invention are now described with reference to the drawings. In the following drawings, identical or corresponding portions are denoted by the same reference numerals, and redundant description is not repeated.

First Embodiment

Figure 2:
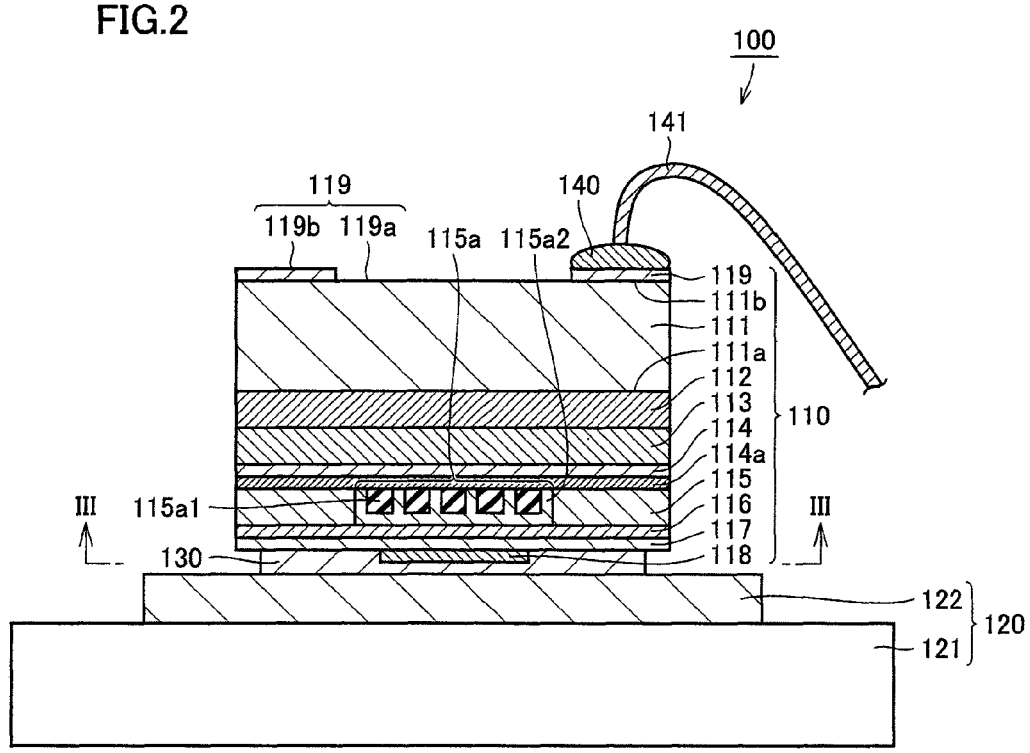
FIG. 2 is a sectional view taken along the line segment II-II in FIG. 1.
Figure 3:
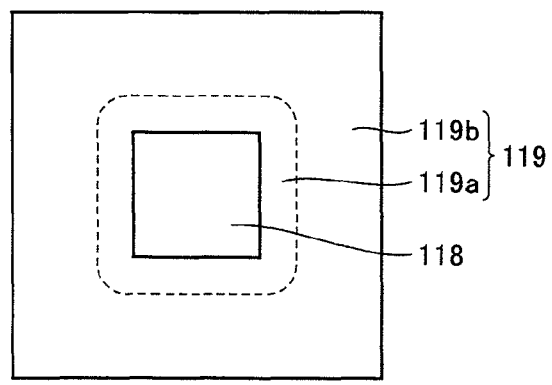
FIG. 3 is a partial perspective view as viewed along arrow in FIG. 2.

FIG. 1 is a schematic top plan view showing a photonic crystal laser according to a first embodiment of the present invention. FIG. 2 is a sectional view taken along the line segment II-II in FIG. 1. FIG. 2 schematically largely illustrates a photonic crystal portion 115*a*. FIG. 3 is a partial perspective view as viewed along arrow in FIG. 2. The photonic crystal laser according to the first embodiment of the present invention is described with reference to FIGS. 1 to 3. A photonic crystal structure denotes a structure having a low refractive index portion made of a material having a relatively low refractive index and a high refractive index portion having a relatively high refractive index so that the refractive index periodically changes.

As shown in FIGS. 1 to 3, a photonic crystal laser 100 according to this embodiment comprises an n-type substrate 111, an n-type clad layer 112, an active layer 113, a p-type clad layer 116, a photonic crystal layer 115, a p-type electrode 118, an n-type electrode 119 and a package member 120. N-type substrate 111 includes a first surface 111*a* and a second surface 111*b* opposite to first surface 111*a*, and is conductive. N-type clad layer 112 is formed on first surface 111*a* of n-type substrate 111. Active layer 113 is formed on n-type clad layer 112, and emits light. P-type clad layer 116 is formed on active layer 113. Photonic crystal layer 115 is formed between n-type clad layer 112 and active layer 113 or between active layer 113 and p-type clad layer 116, and includes photonic crystal portion 115*a* having the photonic crystal structure. P-type electrode 118 is formed on photonic crystal portion 115*a*. N-type electrode 119 is formed on second surface 111*b* of n-type substrate 111, and includes a light-transmitting portion 119*a* arranged on a position opposed to photonic crystal portion 115*a* and an outer peripheral portion 119*b* having lower transmittance of light than light-transmitting portion 119*a*. Package member 120 is formed on p-type electrode 118.

More specifically, photonic crystal laser 100 according to the first embodiment comprises a device 110 including n-type substrate 111, n-type clad layer 112, active layer 113, p-type guide layer 114, p-type electron blocking layer 114*a*, photonic crystal layer 115, p-type clad layer 116, p-type contact layer 117, p-type electrode 118 and n-type electrode 119, a stem package 121, a submount 122, a connecting member 130, an n-type pad electrode, a ball portion 140 for wire bonding and a wire 141, as shown in FIG. 2. Photonic crystal laser 100 has such a junction-down package structure that a p-type semiconductor is arranged on the side of package member 120 (arranged on the lower side in FIG. 2).

As shown in FIG. 1, n-type substrate 111 includes first surface 111*a* and second surface 111*b* opposite to first surface 111*a*. N-type substrate 111, not particularly restricted so far as the same is of a conductive n-type, is preferably a group III-V semiconductor substrate or an SiC (silicon carbide) substrate, more preferably made of gallium nitride (GaN). N-type substrate 111 has a light-transmitting property transmitting light emitted in active layer 113, and the light transmittance is at least 50% when the thickness of n-type substrate 111 is 300 μm, for example.

N-type clad layer 112 is formed on first surface 111*a* of n-type substrate 111, and made of n-type AlGaN, n-type GaN or the like, for example.

Active layer 113 is formed on n-type clad layer 112, and emits light by injection of carriers. Active layer 113 is constituted of a multiple quantum well structure consisting of InGaN and GaN, for example. Alternatively, active layer 113 may be made of a single semiconductor material.

P-type guide layer 114 is formed on active layer 113, and made of GaN, for example.

P-type electron blocking layer 114*a* is formed on p-type guide layer 114, and made of AlGaN, for example. P-type electron blocking layer 114*a* is not particularly restricted to the arrangement formed on p-type guide layer 114, so far as the same is arranged between active layer 113 an photonic crystal layer 115.

Photonic crystal layer 115 is formed on p-type electron blocking layer 114*a* along the direction of extension of first and second surfaces 111*a* and 111*b* of n-type substrate 111. Photonic crystal layer 115 includes photonic crystal portion 115*a*. The region of photonic crystal layer 115 other than photonic crystal portion 115*a* is made of the same material as high refractive index portions 115*a*2 of photonic crystal portion 115*a*, for example.

Photonic crystal portion 115*a* in photonic crystal layer 115 has low refractive index portions 115*a*1 made of a material having a relatively low refractive index and high refractive index portions 115*a*2 made of a material having a relatively high refractive index. In other words, photonic crystal portion 115*a* in photonic crystal layer 115 is a region where low refractive index portions 115*a*1 and high refractive index portions 115*a*2 are periodically arranged. The material constituting low refractive index portions 115*a*1 is not particularly restricted so far as the refractive index thereof is lower than that of the material constituting high refractive index portions 115*a*2. For example, low refractive index portions 115*a*1 are made of silicon oxide ($SiO_2$) having a refractive index of about 1.44, and high refractive index portions 115*a*2 are made of GaN having a refractive index of about 2.54. When the difference between the refractive indices of the materials constituting low refractive index portions 115*a*1 and high refractive index portions 115*a*2 is largely set, light can be effectively confined in the medium of high refractive index portions 115*a*2. Low refractive index portions 115*a*1 are not restricted to silicon oxide but may be made of another material, or may be formed by holes filled with no substance (a state where gas such as air having a refractive index of 1, for example, is present).

Low refractive index portions 115*a*1 or high refractive index portions 115*a*2 line up in a constant direction in the form of a triangular lattice or a tetragonal lattice. The triangular lattice denotes such a case that the number of low refractive index portions 115*a*1 (or high refractive index portions 115*a*2) proximate (or adjacent) to arbitrary low refractive index portion 115*a*1 (or high refractive index portion 115*a*2) is 6 in the anteroposterior direction and a direction extending at an inclination angle of 60° with respect to this anteroposterior direction when photonic crystal portion 115*a* is observed from above. The tetragonal lattice denotes such a case that the number of low refractive index portions 115*a*1 (or high refractive index portions 115*a*2) proximate (or adjacent) to arbitrary low refractive index portion 115*a*1 (or high refractive index portion 115a2) is 8. The pitch indicating the distance connecting the centers of low refractive index portions 115a1 or high refractive index portions 115a2 lining up in the constant direction is set to not more than 160 nm, for example, in view of effectiveness for light having a wavelength of about 400 nm.

P-type clad layer 116 is formed on photonic crystal layer 115, and made of p-type AlGaN, for example. N-type clad layer 112 and p-type clad layer 116 function as conductive layers conducting carriers to be supplied to active layer 113. Therefore, n-type clad layer 112 and p-type clad layer 116 are so provided as to hold active layer 113 therebetween. Further, n-type clad layer 112 and p-type clad layer 116 function as confinement layers confining carriers (electrons and holes) in active layer 113. In other words, n-type clad layer 112, active layer 113 and p-type clad layer 116 form double hetero junction. Therefore, carriers contributing to light emission can be concentrated on active layer 113.

P-type contact layer 117 is formed on p-type clad layer 116, and made of p-type GaN, for example. P-type contact layer 117 is formed for implementing ohmic contact with p-type electrode 118.

P-type electrode 118 is formed on p-type contact layer 117 and on photonic crystal portion 115a. P-type electrode 118 is made of Au (gold), for example.

P-type electrode 118 is not particularly restricted if the same is arranged to overlap at least part of photonic crystal portion 115a. For example, p-type electrode 118 may be arranged substantially at the center on the surface of p-type contact layer 117 as shown in FIGS. 1 to 3, or may be arranged on one end on the surface of p-type contact layer 117. P-type electrode 118 is preferably so sized as to obtain current density necessary for lasing, and sized 100 μm square, for example.

Further, p-type electrode 118 is preferably arranged on the whole region defined by projecting photonic crystal portion 115a on the surface of p-type contact layer 117 as viewed from the side of n-type electrode 119, in such a view that large current can be injected into photonic crystal portion 115a.

N-type electrode 119 is formed on second surface 111b of n-type substrate 111, and includes light-transmitting portion 119a arranged on the position opposed to photonic crystal portion 115a and outer peripheral portion 119b having lower transmittance of the light than light-transmitting portion 119a. Light-transmitting portion 119a is a portion mainly transmitting the emitted light, and outer peripheral portion 119b serves as an electrode for injecting current.

Light-transmitting portion 119a preferably includes the whole region defined by projecting photonic crystal portion 115a on second surface 111b of n-type substrate 111 as viewed from the side of p-type electrode 118. Thus, the area of light-transmitting portion 119a transmitting light can be relatively increased, whereby absorption of light on light-transmitting portion 119a can be further suppressed, and output reduction can be further suppressed.

It is effective to apply nonreflective coating onto light-transmitting portion 119a, in order to reduce reflection of a laser beam diffracted toward an emission surface due to the difference between the refractive index of low refractive index portions 115a1 and the refractive index of high refractive index portions 115a2.

Figure 4:
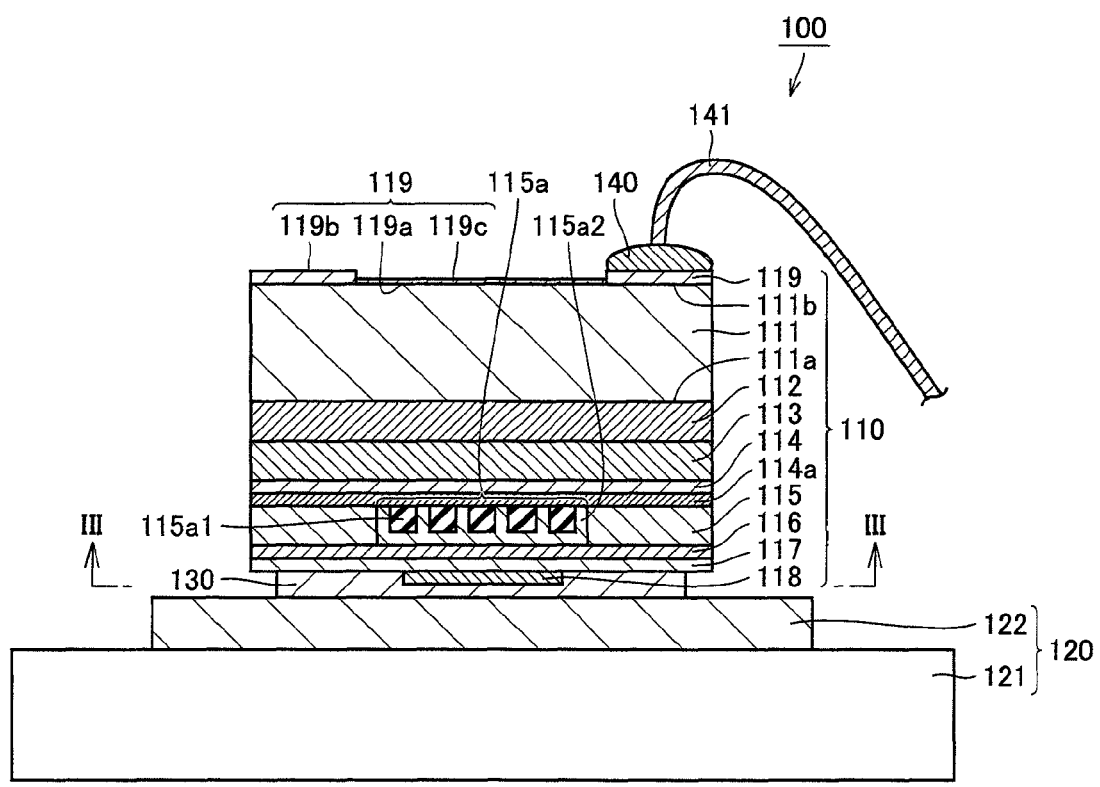
FIG. 4 is a sectional view showing another example of the photonic crystal laser according to the first embodiment of the present invention.

While the overall surface of light-transmitting portion 119a of the n-type electrode is entirely opened, for example, as shown in FIG. 1 and the current is injected only through outer peripheral portion 119b, the present invention is not particularly restricted to this. FIG. 4 is a sectional view showing another example of the photonic crystal laser according to the first embodiment of the present invention. As shown in FIG. 4, the photonic crystal laser preferably further comprises a transparent electrode 119c, made of a material transparent with respect to light, arranged on light-transmitting portion 119a and electrically connected with outer peripheral portion 119b of n-type electrode 119. When transparent electrode 119c is formed, the present invention is not restricted to the case where transparent electrode 119c is formed on the overall surface of light-transmitting portion 119a as shown in FIG. 4, but transparent electrode 119c may be formed on part of light-transmitting portion 119a (not shown).

Figure 5:
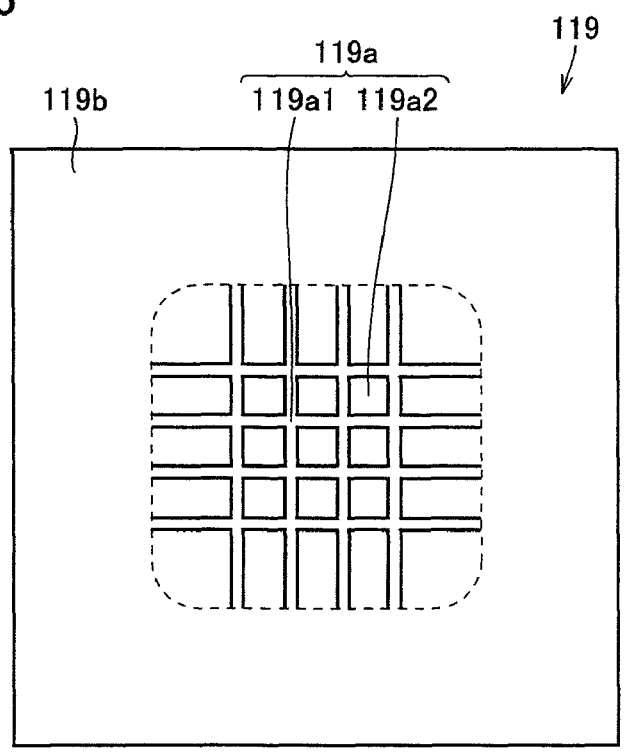
FIG. 5 is another schematic top plan view showing an n-type electrode in the first embodiment of the present invention.
Figure 6:
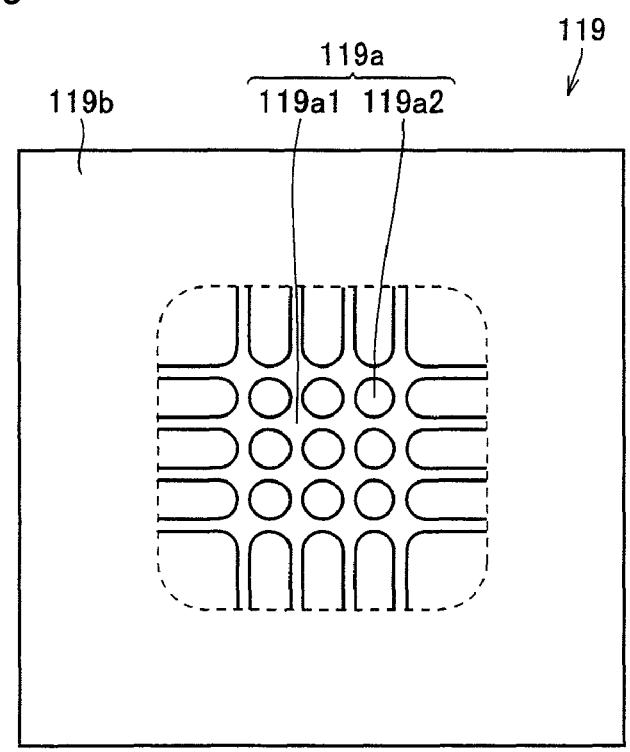
FIG. 6 is still another schematic top plan view showing the n-type electrode in the first embodiment of the present invention.

FIG. 5 is another schematic top plan view showing n-type electrode 119 in the first embodiment of the present invention. FIG. 6 is still another schematic top plan view showing n-type electrode 119 in the first embodiment of the present invention. As shown in each of FIGS. 5 and 6, light-transmitting portion 119a preferably further includes an electrode provided with uniformly dispersed openings 119a2 and electrically connected with outer peripheral portion 119b. As light-transmitting portion 119a including such the electrode, a structure including an electrode 119a1 and openings 119a2 provided with openings in the form of a lattice as shown in FIG. 5, for example, or a structure including an electrode 119a1 and openings 119a2 provided with openings in a polka-dotted manner as shown in FIG. 6, for example, can be listed.

Figure 7:
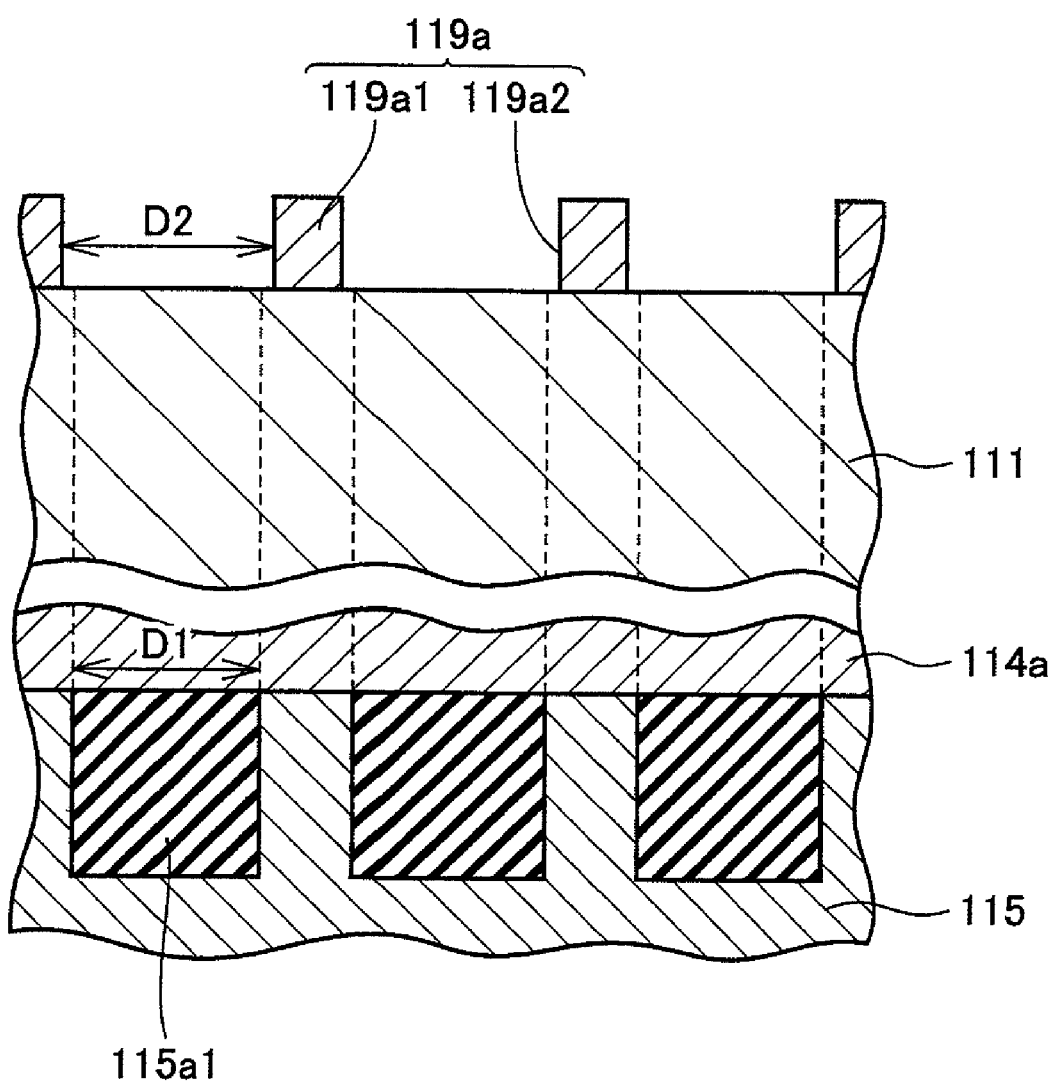
FIG. 7 is a schematic sectional view showing the relation between a light-transmitting portion and a photonic crystal portion of the photonic crystal laser according to the first embodiment of the present invention.

When light-transmitting portion 119a further includes electrode 119a1 provided with uniformly dispersed openings 119a2 and electrically connected with outer peripheral portion 119b, individual openings 119a2 preferably include the whole regions defined by projecting low refractive index portions 115a1 of photonic crystal portion 115a on light-transmitting portion 119a as viewed from the side of the p-type electrode, as shown in FIG. 7. In other words, the diameter D2 of openings 119a2 in light-transmitting portion 119a is preferably larger than the diameter D1 of low refractive index portions 115a1, as shown in FIG. 7. In this case, the ratio of such openings 119a2 that diameter D2 of openings 119a2 is larger than diameter D1 of low refractive index portions 115a1 is preferably at least 50%, more preferably at least 90% of entire openings 119a2. Thus, light of low refractive index portions 115a1 having large output in device 110 can be transmitted while larger current can be fed, whereby the output can be further increased. FIG. 7 is a schematic sectional view showing the relation between the light-transmitting portion and the photonic crystal portion of the photonic crystal laser according to the first embodiment.

In particular, it is effective when light-transmitting portion 119a includes transparent electrode 119c shown in FIG. 4 and electrode 119a1 provided with openings 119a2. In this case, the thickness of transparent electrode 119c can be further reduced and current density can be uniformized even if large current is injected, whereby larger current can be injected and the output can be improved by suppressing absorption of light.

Outer peripheral portion 119b of n-type electrode 119 is formed by a structure obtained by stacking titanium, aluminum, titanium and gold in this order, for example. When n-type electrode 119 includes electrode 119a1, electrode 119a1 is formed by a structure obtained by stacking titanium, aluminum, titanium and gold, for example. The materials constituting electrode 119a1 may be identical to or different from the materials constituting outer peripheral portion 119b.

While light-transmitting portion 119a of n-type electrode 119 shown in FIG. 2 is arranged substantially at the center of second surface 111b of n-type substrate 111, the same may alternatively be arranged on one end of second surface 111b of n-type substrate 111.

While photonic crystal layer 115 is formed between active layer 113 and p-type clad layer 116 in device 110, the same is not particularly restricted to this structure but may alternatively be formed between n-type clad layer 112 and active layer 113.

As shown in FIG. 2, package member 120 is a member for fixing a chip. While package member 120 according to the first embodiment includes stem package 121 and submount 122, the same is not particularly restricted to this structure but may be formed by a single layer or at least three layers. Stem package 121 is made of an iron-based material, for example. Submount 122 is preferably made of a material having high thermal conductivity, and made of AlN (aluminum nitride), for example.

Connecting member 130 electrically connects device 110 and package member 120 with each other. For example, solder of AuSn (tin) or conductive paste of silver can be employed for connecting member 130. Connecting member 130 is so arranged as not to overreach side end portions of device 110, thereby preventing a short circuit of device 110 resulting from connecting member 130.

The n-type pad electrode and ball portion 140 for wire bonding are made of Au, for example. Wire 141 extending from ball portion 140 electrically connects a terminal (not shown) of stem package 121 and n-type electrode 119 with each other. Wire 141 is made of Au, for example.

Figure 8:
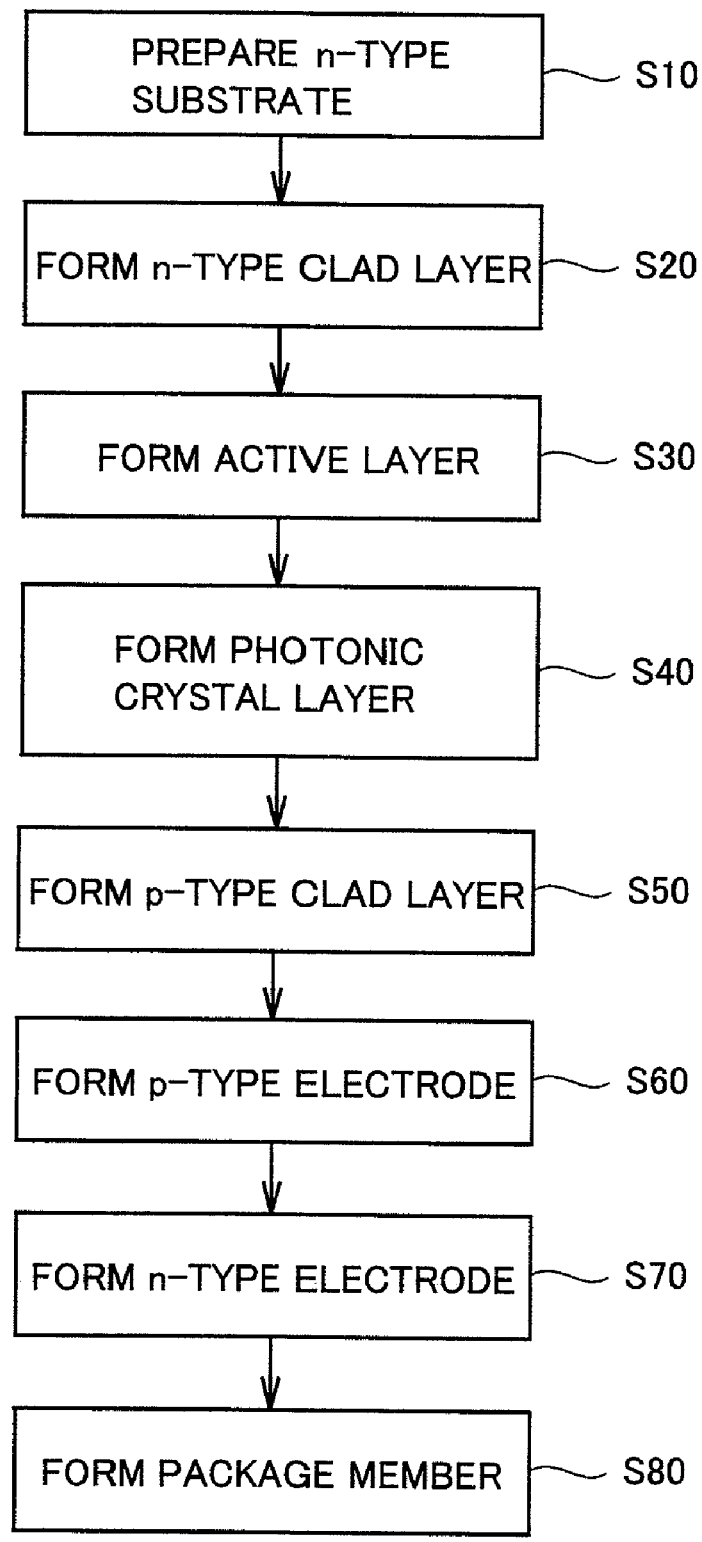
FIG. 8 is a flow chart showing a method of manufacturing the photonic crystal laser according to the first embodiment of the present invention.

A method of manufacturing the photonic crystal laser according to the first embodiment is now described with reference to FIGS. 1 to 8. FIG. 8 is a flow chart showing the method of manufacturing the photonic crystal laser according to the first embodiment of the present invention.

First, a step (S10) of preparing conductive n-type substrate 111 including first surface 111a and second surface 111b opposite to first surface 111a is carried out, as shown in FIGS. 1 to 3 and 8. In this step (S10), it is preferable to prepare a group III-V semiconductor substrate or an SiC substrate, and it is more preferable to prepare a substrate of GaN.

Then, a step (S20) of forming n-type clad layer 112 on first surface 111a of n-type substrate 111 is carried out, as shown in FIGS. 1 to 3 and 8. In this step (S20), n-type clad layer 112 of n-type AlGaN is formed by OMVPE (Organic Metal Vapor Phase Epitaxy: organic metal vapor phase epitaxy), for example.

Then, a step (S30) of forming active layer 113 emitting light on n-type clad layer 112 is carried out, as shown in FIGS. 1 to 3 and 8. In this step (S30), active layer 113 of a multiple quantum well structure consisting of InGaN and GaN is formed by OMVPE, for example.

Then, a step of forming p-type guide layer 114 on active layer 113 is carried out, as shown in FIGS. 1 to 3. In this step, p-type guide layer 114 of GaN is formed by OMVPE, for example.

Then, a step of forming p-type electron blocking layer 114a on p-type guide layer 114 is carried out, as shown in FIGS. 1 to 3. In this step, electron blocking layer 114a of AlGaN is formed by OMVPE, for example. The step of forming p-type electron blocking layer 114a may be carried after the step of forming active layer 113. In this case, the step of forming p-type guide layer 114 is carried out after the step of forming p-type electron blocking layer 114a.

Then, a step (S40) of forming photonic crystal layer 115, formed between active layer 113 and p-type clad layer 116, including photonic crystal portion 115a having the photonic crystal structure is carried out, as shown in FIGS. 1 to 3 and 8. In this step (S40), the steps of forming a film, forming mask layers, performing exposure, performing development, performing dry etching, removing the mask layers and performing epitaxy are carried out. More specifically, the following steps are carried out:

First, the step of forming a film of the material constituting low refractive index portions 115a1 on p-type electron blocking layer 114a is carried out. In this step, a film of $SiO_2$ is formed by plasma CVD (Chemical Vapor Deposition: chemical vapor deposition), for example. The material of the formed film is not particularly restricted to $SiO_2$, so far as the same is the material constituting low refractive index portions 115a1.

Then, the step of forming the mask layers on the aforementioned film constituting low refractive index portions 115a1 is carried out. For example, EB (electron beam) exposure resist (ZEP520 by Nippon Zeon Co., Ltd.) is employed as the mask layers. The mask layers are not restricted to the EB exposure resist, but masks can be formed by etching-transferring EB drawing patterns to insulating films of SiN or the like, for example. Multilayer masks can also be employed.

Then, the step of performing exposure on the mask layers is carried out. In this exposure, mask patterns are directly drawn on the mask layers by EB (electron beam) exposure, for example. These mask patterns are set to prescribed shapes such as circular plane shapes substantially identical to each other and lining up in a constant direction, for example.

Then, the step of performing development is carried out. In this step, the exposed portion is melted with EB, for example. When the mask patterns have the aforementioned shapes, mask layers of circular plane shapes substantially identical to each other and lining up in the constant direction are formed.

Then, the step of performing dry etching is carried out. In this step, RIE such as ICP (inductive Coupled Plasma: inductive coupled plasma)-RIE (Reactive Ion Etching: reactive ion etching) employing fluorocarbon gas such as $CF_4$ or $CHF_3$, for example, can be listed. In the step of performing dry etching, etching progresses in portions not covered with the mask layers, so that low refractive index portions 115a1 of the photonic crystal structure can be formed when the mask layers are circular. When the shapes of the mask layers are circular in plane shapes, low refractive index portions 115a1 are columnar.

The gas employed for dry etching is not restricted to fluorocarbon gas, but $Cl_2$ (chlorine)-based gas or HI (hydriodic acid)-based gas can be employed, for example. Further, inert gas such as argon gas or xenon gas can be mixed into $Cl_2$ gas or HI gas. In this case, the ratio between $Cl_2$ gas or HI gas and the inert gas is preferably set substantially to 2:1.

The dry etching is not restricted to ICP-RIE, but parallel plate RIE may be performed, for example. Further, wet etching or milling may be applied in place of the dry etching.

Then, the step of removing the mask layers is carried out. In this step, the mask layers are removed with a solvent, for example.

Then, the step of forming high refractive index portions 115a2 is carried out. In this step, high refractive index portions 115a2 of GaN, for example, are formed to cover low refractive index portions 115a1 by epitaxially growing the same from p-type guide layer 114 by OMVPE, for example. Thus, photonic crystal layer 115 including photonic crystal portion 115a having the photonic crystal structure including low refractive index portions 115a1 and high refractive index portions 115a2 can be formed.

The step (S40) of forming photonic crystal layer 115 is not restricted to the order carried out between the step (S30) of forming active layer 113 and a step (S50) of forming p-type clad layer 116. The step (S40) of forming photonic crystal layer 115 may be carried out between the step (S20) of forming n-type clad layer 112 and the step (S30) of forming active layer 113.

Then, the step (S50) of forming p-type clad layer 116 on active layer 113 is carried out, as shown in FIGS. 1 to 3 and 8. In this step (S50), p-type clad layer 116 of p-type AlGaN is formed on photonic crystal layer 115 by OMVPE, for example.

Then, a step (S60) of forming p-type electrode 118 on photonic crystal portion 115a is carried out, as shown in FIGS. 1 to 3 and 8. In this step (S60), p-type electrode 118 is formed on p-type contact layer 117 and on photonic crystal portion 115a.

In this step (S60), p-type electrode 118 is formed by vapor-depositing Ni and Au in this order on p-type contact layer 117 and on photonic crystal portion 115a by vapor deposition, for example, and performing alloying.

Then, a step (S70) of forming n-type electrode 119 including light-transmitting portion 119a arranged on the position opposed to photonic crystal portion 115a and outer peripheral portion 119b having the lower light transmittance than light-transmitting portion 119a on second surface 111b of n-type substrate 111 is carried out, as shown in FIG. 8. In this step (S70), light-transmitting portion 119a is preferably so formed as to include the whole region defined by projecting photonic crystal portion 115a on second surface 111b of n-type substrate 111 as viewed from the side of p-type electrode 118.

In the step (S70) of forming n-type electrode 119, a step of applying nonreflective coating onto light-transmitting portion 119a may be further carried out, in order to reduce reflection of the laser beam diffracted due to the difference between the refractive indices of low refractive index portions 115a1 and high refractive index portions 115a2.

In the step (S70) of forming n-type electrode 119, further, a step of forming transparent electrode 119c electrically connected with outer peripheral portion 119b of n-type electrode 119 and made of the material transparent with respect to light further on light-transmitting portion 119a is preferably carried out, as shown in FIG. 4.

In the step (S70) of forming n-type electrode 119, in addition, a step of forming the electrode provided with uniformly dispersed openings 119a2 and electrically connected with outer peripheral portion 119b on light-transmitting portion 119a is preferably carried out, as shown in FIGS. 5 and 6. In this case, the step of forming electrode 119a1 may be performed by etching, or may be performed by lift-off. For example, resist patterns for forming openings 119a2 are formed on light-transmitting portion 119a, a metal film for forming electrode 119a1 is formed thereon, and electrode 119a1 is formed by lift-off.

Light-transmitting portion 119a can be worked into a shape such as that of the structure formed by electrode 119a1 and openings 119a2 provided with openings in the form of a lattice as shown in FIG. 4, for example, or that of the structure formed by electrode 119a1 and openings 119a2 provided with openings in a polka-dotted manner as shown in FIG. 5, for example.

Light-transmitting portion 119a is more preferably so formed that individual openings 119a2 include the whole regions defined by projecting low refractive index portions 115a1 of photonic crystal portion 115a on light-transmitting portion 119a as viewed from the side of the p-type electrode, as shown in FIG. 7.

In the case of forming electrode 119a1, electrode 119a1 similarly having openings 119a2 also in light-transmitting portion 119a may be formed when forming outer peripheral portion 119b. Further, the step of forming electrode 119a1 may be carried out separately from the step of forming outer peripheral portion 119b.

Then, a step of forming the n-type pad electrode on n-type electrode 119 is carried out. In this step, a film of titanium, for example, is formed by vapor deposition, and a gold film is formed on the titanium film by vapor deposition, for example.

Then, a step (S80) of forming package member 120 on p-type electrode 118 is carried out, as shown in FIG. 8. In this step (S80), device 110 and package member 120 are electrically connected with each other through connecting member 130 of solder, for example.

More specifically, stem package 121 made of an iron-based material, for example, is prepared. Then, submount 122 of aluminum nitride is bonded to stem package 121. Then, p-type electrode 118 and submount 122 are connected with each other with a proper quantity of connecting member 130 of solder of AuSn or the like. Thus, a p-down structure capable of electrically connecting the p-type semiconductor layer side of device 110 and package member 120 with each other can be obtained.

Then, a step of electrically connecting n-type electrode 119 and stem package 121 with each other is carried out. In this step, ball portion 140 is connected to the n-type pad electrode by wire bonding, for example, and wire 141 is electrically connected with the terminal (not shown) of stem package 121.

Photonic crystal laser 100 shown in FIGS. 1 to 3 can be manufactured by carrying out the aforementioned steps (S10 to S80).

A light-emitting method of photonic crystal laser 100 is now described with reference to FIGS. 1 to 3.

When a positive voltage is applied to p-type electrode 118, holes are injected from p-type clad layer 116 into active layer 113, and electrons are injected from n-type clad layer 112 into active layer 113. When the holes and the electrons (carriers) are injected into active layer 113, the carriers are recombined, to emit light. The wavelength of the emitted light is defined by the band gap of the semiconductor layer included in active layer 113.

While the light emitted in active layer 113 is confined in active layer 113 by n-type clad layer 112 and p-type clad layer 116, partial light reaches photonic crystal layer 115 as evanescent light. When the wavelength of the evanescent light reaching photonic crystal layer 115 and a prescribed cycle of photonic crystal portion 115a in photonic crystal layer 115 coincide with each other, the light is repetitively diffracted at the wavelength corresponding to the cycle to generate standing waves, and phase conditions are defined. The light whose phase is defined by photonic crystal portion 115a of photonic crystal layer 115 is fed back to the light in active layer 113, and generates standing waves as well. These standing waves satisfy the wavelength of the light and the phase conditions defined in photonic crystal portion 115a of photonic crystal layer 115.

Active layer 113 and photonic crystal layer 115 are formed in a two-dimensionally spreading manner, and hence the above phenomenon can take place in the region around n-type electrode 119 and in the vicinity thereof. When a sufficient quantity of light is stored in this state, light having orderly wavelength and phase conditions is diffracted in a direction (vertical direction in FIG. 1) perpendicular to the main surface of photonic crystal portion 115a in photonic crystal layer 115, i.e., emitted from light-transmitting portion 119a through second surface 111b of n-type substrate 111 serving as a light-emitting surface.

As hereinabove described, photonic crystal laser 100 according to the first embodiment of the present invention comprises p-type electrode 118 formed on photonic crystal portion 115a and n-type electrode 119 including light-transmitting portion 119a arranged on the position opposed to photonic crystal portion 115a and outer peripheral portion 119b having the lower light transmittance than light-transmitting portion 119a. In p-type GaN, for example, a current hardly spreads in the lateral direction in a thin layer having a thickness of about 1 μm, and the current is injected only immediately under an electrode. In other words, a p-type semiconductor has higher resistance as compared with an n-type semiconductor and hence a current hardly spreads in a plane. However, p-type electrode 118 in photonic crystal laser 100 is formed on the position opposed to photonic crystal portion 115a. A current injection region can most supply energy, whereby the current can be sufficiently injected from p-type electrode 118 into photonic crystal portion 115a. Consequently, lasing is easily performed and high output can be easily obtained. Further, the n-type semiconductor has lower resistance as compared with the p-type semiconductor, and hence a current easily spreads in a plane. Therefore, the current can be injected into active layer 113 of the portion limited by p-type electrode 118 even if outer peripheral portion 119b of n-type electrode 119 is not arranged on the position opposed to p-type electrode 118, i.e., immediately under a portion where no electrode is arranged. Further, light-transmitting portion 119a of n-type electrode 119 is arranged on the position opposed to photonic crystal portion 115a, whereby extracted light is hardly absorbed. Consequently, reduction of the output can be suppressed.

In addition, device 110 is packaged on package member 120 on the side of p-type electrode 118, whereby active layer 113 for lasing and photonic crystal portion 115a which is a resonance layer are arranged on positions close to package member 120. Therefore, heat resulting from absorption of carriers causing nonradiative recombination or emitted light by device 110 is effectively dispersed/removed, and the heat radiation situation can be improved. Thus, lasing inhibition or reduction of life resulting from temperature rise can be suppressed, while reduction of laser characteristics can be suppressed. Consequently, reliability of device 110 can be improved.

Second Embodiment

Figure 9:
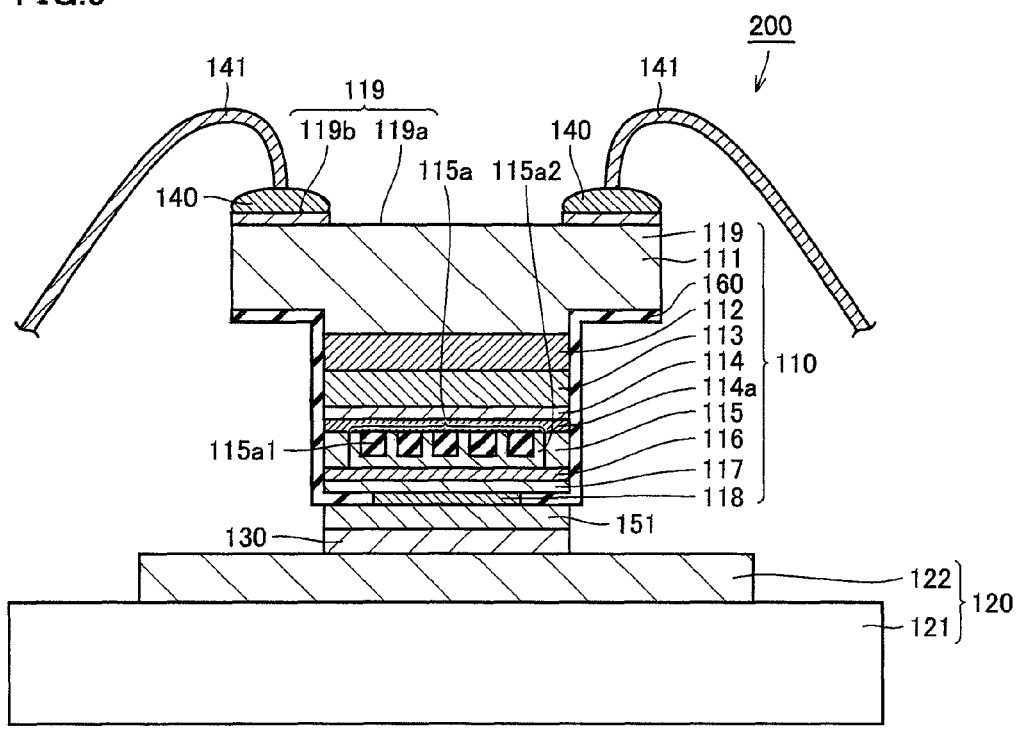
FIG. 9 is a schematic sectional view showing a photonic crystal laser according to a second embodiment of the present invention.

FIG. 9 is a schematic sectional view showing a photonic crystal laser according to a second embodiment of the present invention. The photonic crystal laser according to the second embodiment of the present invention is described with reference to FIG. 9. A photonic crystal laser 200 according to the second embodiment basically has a structure similar to that of photonic crystal laser 100 according to the first embodiment, and is different from the first embodiment shown in FIG. 2 only in points that a mesa structure is formed on the outer periphery of a p-type electrode 118 and that an insulating film 160 is formed on at least part of the surface of the mesa structure.

According to the second embodiment, the mesa structure is formed over p-type electrode 118, a p-type contact layer 117, a p-type clad layer 116, a photonic crystal layer 115, a p-type electron blocking layer 114a, a p-type guide layer 114, an active layer 113, an n-type clad layer 112 and part of an n-type substrate 111 as viewed from p-type electrode 118, as shown in FIG. 9.

Insulating film 160 is formed on the surface of the mesa structure. While insulating film 160 is not particularly restricted so far as the same is made of an insulating material, SiO$_2$ or SiN, for example, can be employed. The material constituting insulating film 160 is preferably an insulating material having a refractive index different from that of a high refractive index material for a photonic crystal portion 115a. While insulating film 160 may be formed by a single layer or a plurality of layers, the same is preferably formed by stacking a plurality of materials having different refractive indices, to be capable of further improving a reflecting effect.

A method of manufacturing photonic crystal laser 200 according to the second embodiment is now described. The method of manufacturing photonic crystal laser 200 according to the second embodiment is basically similar to the method of manufacturing photonic crystal laser 100 according to the first embodiment, and different from the first embodiment only in a point that the same further comprises the steps of forming the mesa structure on the outer periphery of p-type electrode 118 and forming insulating film 160 on at least part of the surface of the mesa structure.

More specifically, a step (S10) of preparing n-type structure 111, a step (S20) of forming n-type clad layer 112, a step (S30) of forming active layer 113, a step of forming p-type guide layer 114, a step of forming p-type electron blocking layer 114a, a step (S40) of forming photonic crystal layer 115, a step (S50) of forming p-type clad layer 116 and a step of forming p-type contact layer 117 are carried out similarly to the first embodiment, as shown in FIGS. 8 and 9.

Then, the step of forming the mesa structure is carried out. This step is carried out as follows, for example: First, a mask layer of resist or the like is so formed as to include a position opposed to photonic crystal portion 115a on p-type contact layer 117. Then, the mesa structure is formed by removing portions opening from the mask layer over p-type contact layer 117, p-type clad layer 116, photonic crystal layer 115, p-type electron blocking layer 114a, p-type guide layer 114, active layer 113, n-type clad layer 112 and part of n-type substrate 111 by etching or the like.

Then, the step of forming insulating film 160 is carried out. In this step, insulating film 160 of SiO$_2$ or SiN is formed by plasma CVD, for example. Then, a mask layer of resist or the like having a pattern including a position opposed to photonic crystal portion 115a is formed. Then, portions of insulating film 1160 opening from the mask layer are removed with hydrofluoric acid, for example.

Then, a step (S60) of forming p-type electrode 118 is carried out. In this step (S60), p-type electrode 118 is formed on an opening portion in insulating film 160 by vacuum deposition or the like.

In the step (S60) of forming p-type electrode 118 in the second embodiment, a step of forming a p-type pad electrode 151 on p-type electrode 118 so that p-type electrode 118 is at the center is further carried out.

Then, a step (S80) of forming a package member 120 is carried out similarly to the first embodiment. Photonic crystal laser 200 according to the second embodiment shown in FIG. 9 can be manufactured by carrying out the aforementioned steps (S10 to S80).

According to photonic crystal laser 200 of the second embodiment of the present invention, as hereinabove described, the mesa structure is formed on the outer periphery of p-type electrode 118, and insulating film 160 is formed on at least part of the surface of the mesa structure. A p-type semiconductor has high resistance and hence a current hardly spreads in the in-plane direction, while a small current spreads due to conductivity. Therefore, spreading of a small reactive current (leakage current) flowing in the plane of the p-type semiconductor can be suppressed by forming the mesa structure, whereby output can be improved by increasing power efficiency.

Further, insulating film 160 can prevent a short circuit resulting from a connecting member when connecting package member 120 and p-type electrode 118 with each other by a connecting member 130 of solder or the like.

Further, a confinement effect for light resulting from reflection or the like can be improved by covering light spreading from photonic crystal portion 115a with insulating film 160 formed on the surface of the mesa structure. Therefore, light can be inhibited from outgoing from portions other than a light-transmitting portion 119a.

Third Embodiment

Figure 10:
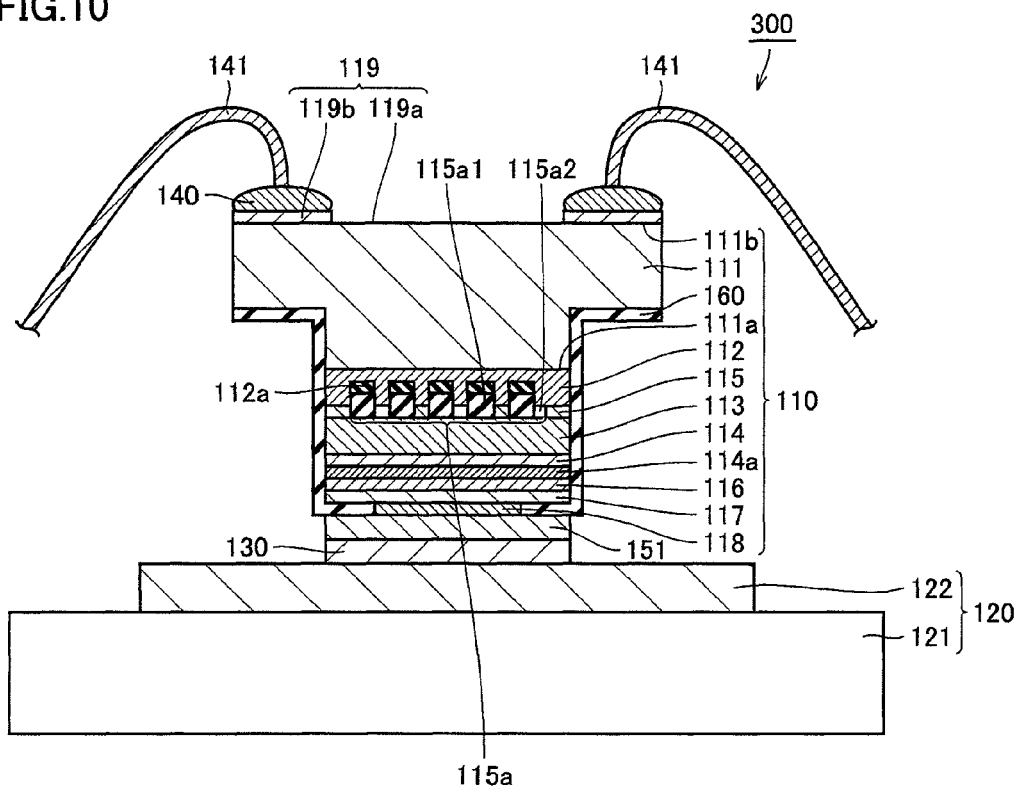
FIG. 10 is a schematic sectional view showing a photonic crystal laser according to a third embodiment of the present invention.

FIG. 10 is a schematic sectional view showing a photonic crystal laser according to a third embodiment of the present invention. The photonic crystal laser according to the third embodiment of the present invention is described with reference to FIG. 10. A photonic crystal laser 300 according to the third embodiment basically has a structure similar to that of photonic crystal laser 200 according to the second embodiment, and is different from the second embodiment shown in FIG. 9 only in a point that a photonic crystal layer 115 is provided on an n-type semiconductor layer side.

According to the third embodiment, photonic crystal layer 115 is formed between an n-type clad layer 112 and an active layer 113, as shown in FIG. 10. In n-type clad layer 112, a plurality of recesses are provided on a surface opposite to a surface in contact with an n-type substrate 111. Insulating films 112a are formed on the bottom surfaces of these recesses. Insulating films 112a are made of $SiO_2$ or the like, for example. Low refractive index portions 115a1 of air, for example, are formed on insulating films 112a. High refractive index portions 115a2 of n-type AlGaN, for example, are formed on regions of n-type clad layer 112 provided with no recesses.

Figure 11:
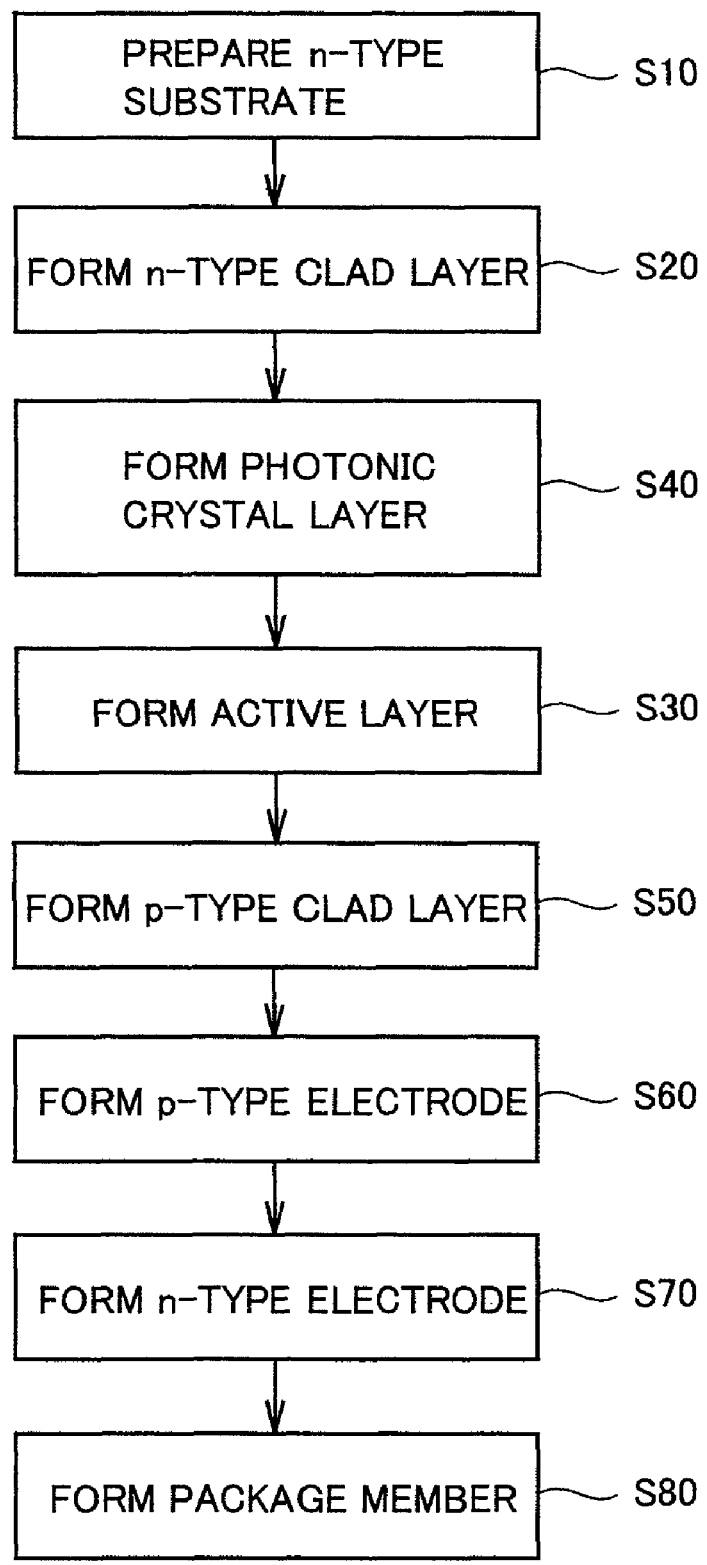
FIG. 11 is a flow chart showing a method of manufacturing the photonic crystal laser according to the third embodiment of the present invention.

A method of manufacturing photonic crystal laser 300 according to the third embodiment is now described with reference to FIGS. 10 and 11. FIG. 11 is a flow chart showing the method of manufacturing the photonic crystal laser according to the third embodiment of the present invention. The method of manufacturing photonic crystal laser 300 according to the third embodiment is basically similar to the method of manufacturing photonic crystal laser 200 according to the second embodiment, and is different from the second embodiment only in a point that a step (S40) of forming photonic crystal layer 115 is carried out between a step (S20) of forming the n-type clad layer and a step (S30) of forming the active layer.

More specifically, a step (S10) of preparing n-type substrate 111 and the step (S20) of forming n-type clad layer 112 are carried out similarly to the second embodiment, as shown in FIGS. 8 and 10.

Then, the step (S40) of forming photonic crystal layer 115 is carried out. According to the third embodiment, this step (S40) is carried out as follows:

More specifically, a mask layer is first formed on the surface of n-type clad layer 112 opposite to the surface in contact with n-type substrate 111. This mask layer is exposed, and thereafter developed. Thus, openings (patterns) can be formed in the mask layer. Then, portions of n-type clad layer 112 exposed from the openings of this mask layer are removed by dry etching or the like, for example, not to expose n-type substrate 111. Then, the mask layer is removed.

Then, insulating films 112a of $SiO_2$ or the like are formed on the bottom surfaces of the recesses of n-type clad layer 112 by vapor deposition or the like, for example. At this time, insulating films 112a are so formed as not to cover all of the recesses of n-type clad layer 112.

Then, high refractive index portions 115a2 of n-type AlGaN are formed on n-type clad layer 112 by OMVPE, for example. At this time, crystal growth hardly takes place on insulating films 112a formed on the recesses of n-type clad layer 112, whereby holes are formed. Thus, photonic crystal layer 115 including a photonic crystal portion 115a having low refractive index portions 115a1 of the air present in these holes and high refractive index portions 115a2 of n-type AlGaN can be formed.

Then, a step (S30) of forming active layer 113, a step of forming a p-type guide layer 114, a step of forming a p-type electron blocking layer 114a, a step (S50) of forming a p-type clad layer 116 and a step of forming a p-type contact layer 117 are carried out similarly to the second embodiment. Then, a step of forming a mesa structure and a step of forming an insulating film are carried out similarly to the second embodiment. Then, a step (S60) of forming a p-type electrode 118, a step (S70) of forming an n-type electrode and a step (S80) of forming a package member 120 are carried out similarly to the second embodiment.

Photonic crystal laser 300 according to the third embodiment shown in FIG. 10 can be manufactured by carrying out the aforementioned steps (S10 to S80).

According to photonic crystal laser 300 of the third embodiment of the present invention, as hereinabove described, photonic crystal layer 115 is formed on the n-type semiconductor layer side. In order to form photonic crystal layer 115 on the n-type semiconductor layer side, insulating films 112a are preferably further formed so that the same are in contact with low refractive index portions 115a1 and atoms (Si, for example) constituting the same are those of an n-type impurity. In this case, the atoms constituting insulating films 112a are those of the n-type impurity, whereby characteristic deterioration such as voltage rise of photonic crystal laser 300 can be suppressed.

Further, insulating films 112a are so formed on the bottom surfaces of the recesses of n-type clad layer 112 that crystals of GaN or AlGaN hardly grow and deposit on insulating films 112a, whereby holes maintaining excellent shapes can be formed on insulating films 112a formed on the recesses of n-type clad layer 112. Thus, low refractive index portions 115a1 can be excellently formed.

EXAMPLES

While the present invention is more detailedly described with reference to Examples, the present invention is not restricted to these.

Example 1

According to Example 1, photonic crystal laser 200 was manufactured according to the method of manufacturing photonic crystal laser 200 in the second embodiment shown in FIG. 9.

More specifically, in the step (S10) of forming n-type substrate 111, an n-type GaN substrate having a thickness of 400 μm was prepared. Then, in the step (S20) of forming n-type clad layer 112, n-type substrate 111 was introduced into an OMVPE furnace, to form n-type clad layer 112 of n-type GaN having a thickness of 2 μm on n-type substrate 111. Then, in the step (S30) of forming active layer 113, active layer 113 of an InGaN quantum well type having a total thickness of 50 nm was formed on n-type clad layer 112 continuously in the OMVPE furnace. Then, in the step of forming p-type guide layer 114, p-type guide layer 114 of GaN having a thickness of 50 nm was formed on active layer 113 continuously in the OMVPE furnace. Then, in the step of forming p-type electron blocking layer 114a, p-type electron blocking layer 114a of AlGaN having a thickness of 20 nm was formed on p-type guide layer 114 continuously in the OMVPE furnace.

Then, the step (S40) of forming photonic crystal layer 115 was carried out as follows: After carrying out the step of forming p-type electron blocking layer 114a, the sample was temporarily taken out from the OMVPE furnace. Then, a film of $SiO_2$ having a thickness of 50 nm was formed on p-type guide layer 114 by plasma CVD. Then, a resist pattern prepared by arraying circular plates of 80 nm in diameter in the form of a tetragonal lattice at a pitch of 150 nm was formed on a region of 300 μm substantially at the center of the film of $SiO_2$ with an electron beam drawing apparatus. Then, portions of the film of $SiO_2$ exposed from the resist pattern were removed with $CF_4$ gas in an ICP-RIE apparatus. Then, the resist pattern was removed with a solvent. Thus, such low refractive index portions 115a1 that columns of $SiO_2$ having a height of 50 nm were arrayed in the form of a tetragonal lattice at the pitch of 150 nm were formed. Then, high refractive index portions 115a2 were formed by introducing the layer in the state provided with low refractive index portions 115a1 into the OMVPE furnace and growing p-type GaN to fill up low refractive index portions 115a1. Thus, photonic crystal layer 115 including photonic crystal portion 115a consisting of low refractive index portions 115a1 and high refractive index portions 115a2 was formed.

Then, in the step (S50) of forming p-type clad layer 116, p-type clad layer 116, of p-type AlGaN having a thickness of 600 nm was formed on photonic crystal layer 115 continuously in the OMVPE furnace. Then, p-type contact layer 117 of p-type GaN having a thickness of 50 nm was formed on p-type clad layer 116 continuously in the OMVPE furnace.

Then, in the step of forming the mesa structure, a resist mask 400 μm square was formed by photolithography, to include a region opposed to photonic crystal portion 115a. Then, the mesa structure was formed by digging the sample up to the n-type clad layer by etching with $Cl_2$ gas, while using an ICP-RIE apparatus. Then, the resist mask was removed with a solvent.

Then, in the step of forming insulating film 160, a film of $SiO_2$ having a thickness of 300 nm was formed on the surface of the mesa structure as insulating film 160 with a plasma CVD apparatus.

Then, in the step (S60) of forming p-type electrode 118, a resist pattern provided with an opening 200 μm square was formed by photolithography on a position opposed to photonic crystal portion 115a on insulating film 160. Then, the portion of insulating film 160 located under the opening was removed with hydrofluoric acid. Then, p-type electrode 118 150 μm square having a structure obtained by stacking Ni and Au was formed at the center of the opening of insulating film 160.

Then, in the step (S70) of forming n-type electrode 119, second surface 111b of n-type substrate 111 was first polished to be a mirror surface, and the thickness was set to 100 μm. Then, a damaged layer of the polished surface was removed with $Cl_2$ gas in the ICP-RIE apparatus. Then, a resist mask 150 μm square was formed on second surface 111b of n-type substrate 111 on a position opposed to photonic crystal portion 115a. Then, a metal film having a structure obtained by stacking Ti and Al was formed, and the resist mask was removed. The n-type electrode including light-transmitting portion 119a and outer peripheral portion 119b prepared by stacking Ti and Al was formed by lift-off. Further, the sample was introduced into a heating furnace, and subjected to annealing at 500° C.

Then, such p-type pad electrode 151 that Ti and Au were stacked in 500 μm square was formed on p-type electrode 118 so that p-type electrode 118 was at the center. Further, an n-type pad electrode prepared by stacking Ti and Au was formed also on outer peripheral portion 119b of n-type electrode 119.

Then, in the step (S80) of forming package member 120, submount 122 of aluminum nitride was first bonded to stem package 121 of an iron-based material. Then, a proper quantity of solder of AuSn serving as a connecting member was applied onto submount 122, to electrically connect the same with p-type pad electrode 151. Further, n-type electrode 119 and the terminal of stem package 121 were bonded with ball portion 140 of Au and wire 141.

The photonic crystal laser according to Example 1 was manufactured by carrying out the aforementioned steps.

Example 2

A method of manufacturing a photonic crystal laser according to Example 2 is basically similar to the method of manufacturing the photonic crystal laser according to Example 1, and different from Example 1 only in the step (S40) of forming photonic crystal layer 115, the step of forming the mesa structure, the step of forming insulating film 160, the step (S60) of forming p-type electrode 118, the step (S70) of forming n-type electrode 119 and the step (S80) of forming package member 120.

More specifically, the step (S10) of preparing the n-type substrate, the step (S20) of forming n-type clad layer 112, the step (S30) of forming active layer 113, the step of forming p-type guide layer 114 and the step of forming p-type electron blocking layer 114a were carried out similarly to Example 1.

Then, in the step (S40) of forming photonic crystal layer 115, the step of forming p-type guide layer 114 was first carried out, and the sample was thereafter temporarily taken out from the OMVPE furnace. Then, a resist pattern prepared by arraying discoidal openings of 70 nm in diameter in the form of a tetragonal lattice at a pitch of 150 nm was formed on p-type guide layer 114 on a hexagonal region of photonic crystal layer 115 having an opposite length of 400 μm with an electron beam drawing apparatus. Then, a film of $Al_2O_3$ was formed by 50 nm with an electron beam evaporation apparatus. Then, the resist pattern was removed with a solvent. Such low refractive index portions 115a1 that hexagonal columns of $Al_2O_3$ having a diameter of 70 nm and a height of 50 nm were arrayed in the form of a tetragonal lattice at the pitch of 150 nm were formed by lift-off. Then, high refractive index portions 115a2 were formed by introducing the layer in the state provided with low refractive index portions 115a1 into the OMVPE furnace and growing p-type GaN to fill up low refractive index portions 115a1, similarly to Example 1. Thus, photonic crystal layer 115 including photonic crystal portion 115a consisting of low refractive index portions 115a1 and high refractive index portions 115a2 was formed.

Then, in the step of forming the mesa structure, a hexagonal resist mask having an opposite length (width across corners) of 500 μm was formed by photolithography, to include photonic crystal portion 115a. Then, the mesa structure was formed by digging the sample up to the n-type clad layer by etching with Cl$_2$ gas while using an ICP-RIE apparatus, similarly to Example 1. Then, the resist mask was removed with a solvent.

Then, in the step of forming insulating film 160, a film of SiN having a thickness of 300 nm was formed on the surface of the mesa structure as insulating film 160 with a plasma CVD apparatus.

Then, in the step (S60) of forming p-type electrode 118, a resist pattern provided with a hexagonal opening having an opposite length of 300 μm was formed by photolithography on insulating film 160 on a position opposed to photonic crystal portion 115a. Then, the portion of insulating film 160 located under the opening was removed with hydrofluoric acid, similarly to Example 1. Then, p-type electrode 118, prepared by stacking Ni and Au, in the form of a hexagon having an opposite length of 200 μm was formed at the center of the opening of insulating film 160. Further, the sample was introduced into the heating furnace and subjected to annealing at 500° C.

Then, in the step (S70) of forming n-type electrode 119, second surface 111b of n-type substrate 111 was polished to be a mirror surface and the thickness was set to 100 μm, similarly to Example 1. Then, a damaged layer of the polished surface was removed with Cl$_2$ gas in the ICP-RIE apparatus, similarly to Example 1. Then, a hexagonal resist mask having an opposite length of 200 μm was formed on second surface 111b of n-type substrate 111 on a position opposed to photonic crystal portion 115a. Then, a metal film of ITO (Indium-Tin-Oxide: indium tin oxide) was formed, and the resist mask was removed. N-type electrode 119 including light-transmitting portion 119a and outer peripheral portion 119b of ITO was formed by lift-off.

Then, p-type pad electrode 151 prepared by stacking Ti and Au on a hexagonal region having an opposite length of 500 μm was formed on p-type electrode 118 so that p-type electrode 118 was at the center. Further, the n-type pad electrode was formed also on outer peripheral portion 119b of n-type electrode 119, by performing patterning so that the n-type pad electrode prepared by stacking Ti and Au was arranged at the center.

Then, in the step of forming package member 120, submount 122 of aluminum nitride was first bonded to stem package 121 of an iron-based material. Then, a proper quantity of silver paste was employed as connecting member 130 in place of solder on submount 122, to electrically connect the same with p-type pad electrode 151. Further, the n-type pad electrode and the terminal of stem package 121 were bonded with ball portion 140 of Au and wire 141.

The photonic crystal laser according to Example 2 was manufactured by carrying out the aforementioned steps.

Example 3

A method of manufacturing a photonic crystal laser according to Example 3 is basically similar to the method of manufacturing the photonic crystal laser according to Example 1, and different from Example 1 only in points that photonic crystal layer 115 is provided between n-type clad layer 112 and active layer 113 and that low refractive index portions 115a1 includes air. According to Example 3, photonic crystal laser 300 was manufactured according to the method of manufacturing photonic crystal laser 300 in the third embodiment shown in FIG. 10.

More specifically, the step (S10) of forming n-type substrate 111 was carried out similarly to Example 1. Then, in the step (S20) of forming n-type clad layer 112, n-type clad layer 112 of n-type AlGaN having a thickness of 2 μm was formed on n-type substrate 111 by introducing the same into the OMVPE furnace.

Then, the step (S40) of forming photonic crystal layer 115 was carried out as follows: First, n-type substrate 111 and n-type clad layer 112 formed thereon were taken out from the OMVPE furnace. Then, a pattern prepared by arraying openings of 80 nm in diameter in the form of a tetragonal lattice at a pitch of 150 nm was formed on a region, 300 μm square, of n-type clad layer 112 with an electron beam drawing apparatus. Thus, a resist pattern serving as a mask layer was formed. Then, portions of n-type clad layer 112 exposed from the resist pattern were removed with Cl$_2$ gas while using an ICP-RIE apparatus so that the depth was 100 nm. Thus, a plurality of recesses were formed in n-type clad layer 112. Insulating films 112a were formed by vapor-depositing SiO$_2$ by 10 nm on the bottom surfaces of these recesses by electron beam vapor deposition. Thereafter the resist pattern was removed with a solvent. Thus, such low refractive index portions 115a1 that holes covered with insulating films 112a of SiO$_2$ having a thickness of 10 nm on the bottom surfaces were arrayed in the form of a tetragonal lattice were formed at the pitch of 150 nm, with the diameter of 80 nm and the depth of 100 nm.

The sample was introduced into the OMVPE furnace again in this state, and n-type AlGaN was grown in an atmosphere of 10 kPa so that the thickness was 100 nm while holding the holes. Thus, photonic crystal layer 115 including photonic crystal portion 115a including low refractive index portions 115a1 of air and high refractive index portions 115a2 of AlGaN was formed.

Then, the step (S30) of forming active layer 113, the step of forming p-type guide layer 114, the step of forming electron blocking layer 114a, the step (S50) of forming p-type clad layer 116 and the step of forming p-type contact layer 117 were carried out in this order, similarly to Example 1.

Then, the step of forming the mesa structure, the step of forming insulating film 160 and the step of forming p-type electrode 118 were carried out similarly to Example 1. Then, the step of forming n-type electrode 119 was carried out similarly to Example 1, except the point that the second surface of n-type substrate 111 was polished to be a mirror surface so that the thickness of n-type substrate 111 was 120 μm and the point that a resist mask 180 μm square was formed on a position opposed to photonic crystal portion 115a.

Then, the step of forming p-type pad electrode 151 and the step (S80) of forming package member 120 were carried out similarly to Example 1. The photonic crystal laser according to Example 3 was manufactured by carrying out the aforementioned steps.

(Measurement Results)

A current was fed to each of the photonic crystal lasers according to Examples 1 to 3. As a result, light-transmitting portion 119a of n-type electrode 119 lased in each of the photonic crystal lasers according to Examples 1 to 3.

According to each of Examples, as hereinabove described, it has been confirmed that light can be extracted from light-transmitting portion 119a due to the comprisal of p-type electrode 118 formed on photonic crystal portion 115a and n-type electrode 119 including light-transmitting portion 119a arranged on the position opposed to photonic crystal portion 115a and outer peripheral portion 119b having the lower light transmittance than light-transmitting portion 119a.

The embodiments and Examples disclosed this time are to be considered as illustrative in all points and not restrictive. The scope of the present invention is shown not by the aforementioned embodiments but by the scope of claims for patent, and it is intended that all modifications within the meaning and range equivalent to the scope of claims for patent are included.

INDUSTRIAL APPLICABILITY

The photonic crystal laser according to the present invention can improve the output, whereby the same can be preferably employed for a laser printer or a recording medium reader/writer, for example.

The invention claimed is:

1. A photonic crystal laser comprising:
a conductive n-type substrate including a first surface and a second surface opposite to said first surface;
an n-type clad layer formed on said first surface of said n-type substrate;
an active layer formed on said n-type clad layer for emitting light;
a p-type clad layer formed on said active layer;
a photonic crystal layer, formed between said n-type clad layer and said active layer or between said active layer and said p-type clad layer, including a photonic crystal portion having a photonic crystal structure, the photonic crystal portion including a high refractive portion and a low refractive portion positioned within the high refractive portion;
a p-type electrode formed on said photonic crystal portion;
an n-type electrode, formed on said second surface of said n-type substrate, including a light-transmitting portion comprising an opening in the n-type electrode arranged on a position opposed to said photonic crystal portion and an outer peripheral portion having lower transmittance of said light than said light-transmitting portion; and
a package member formed on said p-type electrode.

2. The photonic crystal laser according to claim 1, wherein
a mesa structure is formed on the outer periphery of said p-type electrode, and
an insulating film is formed on at least part of the surface of said mesa structure.

3. The photonic crystal laser according to claim 1, wherein said light-transmitting portion includes the whole region defined by projecting said photonic crystal portion on said second surface of said n-type substrate as viewed from the side of said p-type electrode.

4. The photonic crystal laser according to claim 1, wherein said light-transmitting portion further includes an electrode provided with uniformly dispersed openings and electrically connected with said outer peripheral portion.

5. The photonic crystal laser according to claim 1, further comprising a transparent electrode, made of a material transparent with respect to said light, arranged on said light-transmitting portion and electrically connected with said outer peripheral portion of said n-type electrode.

6. The photonic crystal laser according to claim 1, wherein said n-type substrate is made of gallium nitride.

* * * * *